United States Patent
Suzuki et al.

(10) Patent No.: US 7,642,496 B2
(45) Date of Patent: Jan. 5, 2010

(54) PHOTODETECTOR INCLUDING A PLURALITY OF PHOTODIODES

(75) Inventors: Yasuhiro Suzuki, Hamamatsu (JP);
Seiichiro Mizuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 516 days.

(21) Appl. No.: 10/540,476

(22) PCT Filed: Dec. 25, 2003

(86) PCT No.: PCT/JP03/16802

§ 371 (c)(1),
(2), (4) Date: Feb. 13, 2006

(87) PCT Pub. No.: WO2004/059268

PCT Pub. Date: Jul. 15, 2004

(65) Prior Publication Data

US 2006/0197083 A1    Sep. 7, 2006

(30) Foreign Application Priority Data

Dec. 25, 2002 (JP) ............................ 2002-375115

(51) Int. Cl.
*H04N 3/14* (2006.01)
(52) U.S. Cl. .............. 250/208.1; 250/214 A; 250/214 R; 348/294; 348/301
(58) Field of Classification Search .............. 250/208.1, 250/214 R, 214 A, 214 LS; 348/192, 301, 348/307, 608, 294
See application file for complete search history.

(56) References Cited

U.S. PATENT DOCUMENTS 7,286,172 B2 * 10/2007 Mizuno et al. .............. 348/294

FOREIGN PATENT DOCUMENTS

EP    1 154 483 A11    11/2001

(Continued)

OTHER PUBLICATIONS

S.L. Garverick, et al., "A 32-Channel Charge Readout IC for Programmable, Nonlinear Quantization of Multichannel Detector Data", IEEE Journal of Solid-State Circuits, vol. 30, No. 5, pp. 533-541, 1995.

*Primary Examiner*—Thanh X Luu
*Assistant Examiner*—Tony Ko
(74) *Attorney, Agent, or Firm*—Drinker Biddle & Reath LLP

(57) ABSTRACT

The present invention aims at providing a photodetector which can detect the incident light intensity with a high speed while having a wide dynamic range for incident light intensity detection. Each photodiode $PD_{m,n}$ generates electric charges Q by an amount corresponding to the intensity of light incident thereon. An electric charge amount level determining circuit $10_{m,n}$ is provided so as to correspond to the photodiode $PD_{m,n}$, determines the level of the amount of electric charges Q generated by the photodiode $PD_{m,n}$, and outputs a level signal Level indicative of the result of level determination. The capacitance value of the integral capacitance part 21 in the integrating circuit $20_m$ is set by the respective level signals Level sequentially fed from N electric charge amount level determining circuits $10_{m,1}$ to $10_{m,N}$. The integrating circuit $20_m$ accumulates the electric charges Q fed to the input terminal sequentially from the N electric charge amount level determining circuits $10_{m,1}$ to $10_{m,N}$ into the integral capacitance part 21, and outputs a voltage $V_{20}$ corresponding to the amount of thus accumulated electric charges Q from the output terminal.

6 Claims, 7 Drawing Sheets

FOREIGN PATENT DOCUMENTS

| | | |
|---|---|---|
| JP | 62-203531 | 12/1987 |
| JP | 63-204131 A | 8/1988 |
| JP | 63-205527 A | 8/1988 |
| JP | 7-333348 | 12/1995 |
| JP | 10-142051 A | 5/1998 |
| JP | 2000-310561 A | 11/2000 |
| JP | 2001-54020 A | 2/2001 |
| JP | 2001-141562 A | 5/2001 |
| JP | 2001-203936 | 7/2001 |
| JP | 2001-291877 A | 10/2001 |
| JP | 2002-340670 | 11/2002 |
| JP | 2004-207505 | 7/2004 |
| WO | 02/012845 A1 | 2/2002 |

* cited by examiner

PHOTODETECTOR INCLUDING A PLURALITY OF PHOTODIODES

TECHNICAL FIELD

The present invention relates to a photodetector including a plurality of photodiodes arranged.

BACKGROUND ART

A photodetector is an apparatus comprising a plurality of photodiodes arranged one-dimensionally or two-dimensionally, and an integrating circuit including an amplifier and an integral capacitance part, and may further comprise signal processing circuits subsequent thereto. In this photodetector, each photodiode outputs electric charges by an amount corresponding to the intensity of light incident thereon, these electric charges are accumulated in the integral capacitance part, and the integrating circuit outputs a voltage corresponding to the amount of thus accumulated electric charges. According to the voltage outputted from the integrating circuit in response to the amount of respective electric charges generated by a plurality of photodiodes, the light incident on the photosensitive surface on which the plurality of photodiodes are arranged is detected. There is a case where the photodetector further comprises an A/D converter which converts voltages (analog values) outputted from the integrating circuit, into digital values. In this case, the incident light intensity is obtained as a digital value, which can further be processed by a computer or the like.

Such a photodetector can be manufactured by the CMOS technology, and can enlarge its dynamic range for detecting the incident light intensity by changing the capacitance value of the integral capacitance part included in the integrating circuit. A photodetector described in S. L. Garverick, et al., "A 32-Channel Charge Readout IC for Programmable, Nonlinear Quantization of Multichannel Detector Data", IEEE Journal of Solid-State Circuits, Vol. 30, No. 5, pp. 533-541 (1995), for example, includes an integrating circuit in which an integral capacitance part having a variable capacitance value is arranged between input and output terminals of an amplifier, so that electric charges outputted from photodiodes are accumulated in the integral capacitance part, and a voltage corresponding to the amount of thus accumulated electric charges is outputted. The photodetector described in the document mentioned above enlarges the dynamic range for incident light intensity detection by appropriately setting the capacitance value of the integral capacitance part under external control.

Namely, when the capacitance value of the integral capacitance part is made smaller, the detection sensitivity becomes higher even if the incident light intensity is low. When the capacitance value of the integral capacitance part is made greater, on the other hand, output signals are kept from being saturated even if the incident light intensity is high. Using this photodetector makes it possible to capture an object while keeping output signals from being saturated even when the object is very bright as in the daytime in the middle of summer, for example. Also, the object can be captured with a favorable sensitivity even when the object is very dark as in the nighttime, for example.

When the brightness greatly varies depending on the position on the object in the photodetector described in the above-mentioned document, however, output signals in a brighter part of the object may be saturated if darker parts of the object are to be captured with a favorable sensitivity. When captured so as to keep brighter parts of the object from being saturated, on the other hand, the imaging sensitivity may become worse in darker parts of the object. Thus, though enlarging the dynamic range for incident light detection by appropriately setting the capacitance value of the integral capacitance part for each capture, the above-mentioned photodetector does not enlarge the dynamic range for incident light detection part per pixel in one picture.

An invention aimed at solving such a problem is disclosed in International Publication No. 02/12845 pamphlet. The photodetector disclosed in this International Publication pamphlet comprises an integrating circuit including an integral capacitance part having a variable capacitance value, and an electric charge amount level determining circuit for determining the level of the amount of respective electric charges generated in photodiodes. One of a plurality of photodiodes is chosen, the level of the amount of electric charges generated in thus chosen photodiode is determined by the electric charge amount level determining circuit, the capacitance value of the integral capacitance part is set according to thus determined electric charge amount level, and then an operation of accumulating the electric charges generated in the chosen photodiode is started in the integrating circuit. Such a configuration allows the photodetector to enlarge the dynamic range for incident light intensity detection for each photodiode (i.e., per pixel in one picture).

DISCLOSURE OF THE INVENTION

However, the photodetector disclosed in the above-mentioned International Publication pamphlet requires a number of steps after choosing one of a plurality of photodiodes until the electric charge accumulating operation in the integrating circuit started as mentioned above. Therefore, this photodetector may be problematic in that a high-speed photodetecting operation is difficult.

In order to overcome the problem mentioned above, it is an object of the present invention to provide a photodetector which can detect the incident light intensity with a high speed while having a wide dynamic range for incident light intensity detection.

The photodetector in accordance with the present invention comprises (1) N photodiodes (N being an integer of 2 or greater) each generating an electric charge by an amount corresponding to an intensity of light incident thereon; (2) N electric charge amount level determining circuits, respectively arranged so as to correspond to the N photodiodes, for determining respective levels of amounts of electric charges generated in the photodiodes and outputting respective level signals indicative of results of level determinations; (3) an integrating circuit including an integral capacitance part having a variable capacitance value, which is set according to the level signal, accumulating an electric charge fed from the input terminal into the integral capacitance part, and outputting a voltage corresponding to an amount of the accumulated electric charge, from the output terminal; (4) first switches respectively provided so as to correspond to the N photodiodes, and arranged between the respective photodiodes and the input terminal of the integrating circuit; and (5) second switches respectively provided so as to correspond to the N electric charge amount level determining circuits, and arranged between the respective electric charge amount level determining circuits and the integral capacitance part.

In the photodetector in accordance with the present invention, electric charges are generated by an amount corresponding to the intensity of light incident on a photodiode, and the level of electric charges is determined by an electric charge amount level determining circuit. According to thus determined electric charge amount level, the capacitance value of the integral capacitance part in the integrating circuit is set. Thereafter, in the integrating circuit, the electric charges generated in the photodetector are accumulated in the integral capacitance part, and a voltage signal having a value corresponding to thus accumulated amount of electric charges is outputted. When the incident light intensity is high, the capacitance value of the variable capacitance part in the integrating circuit is set to a relatively large value, whereby even the high incident light intensity can be detected without saturation. When the incident light intensity is low, on the other hand, the capacitance value of the variable capacitance part in the integrating circuit is set to a relatively small value, whereby even the low incident light intensity can be detected with a favorable sensitivity. Since the electric charge amount level determining circuits are provided in a one-to-one relationship with respect to the photodiodes in this photodetector, the capacitance value of the integral capacitance part in the integrating circuit can be set rapidly, whereby the incident light intensity can be detected with a high speed.

Preferably, the photodetector in accordance with the present invention further comprises an A/D converter circuit for inputting the voltage outputted from the output terminal of the integrating circuit, A/D-converting the voltage into a digital value corresponding to the voltage, and outputting the digital value. In this case, the voltage outputted from the integrating circuit is fed into the A/D converter circuit, so as to be converted into the digital value, which is then outputted from the A/D converter circuit.

Preferably, the photodetector in accordance with the present invention further comprises a shift circuit for inputting the digital value outputted from the A/D converter circuit, shifting bits of the digital value according to the level signal, and outputting the bit-shifted digital value. In this case, the digital value outputted from the A/D converter circuit is outputted by the shift circuit after the bits of the digital value are shifted by the shift circuit according to the electric charge amount level determined by the electric charge amount level determining circuit.

Preferably, in the photodetector in accordance with the present invention, the integral capacitance part is settable to a first or second capacitance value, the first capacitance value is $2^p$ times as large as the second capacitance value (p being an integer of 1 or greater), the A/D converter circuit outputs a digital value with a bit number of p or greater, and the shift circuit shifts the digital value by p bits according to the level signal. In this case, the digital value outputted from the A/D converter circuit is shifted by p bits when necessary, whereby the resulting digital value attains an excellent linearity with respect to the incident light intensity.

Preferably, the photodetector in accordance with the present invention further comprises a control circuit for controlling opening and closing of each of the first and second switches, wherein, for each of the N photodiodes, the control circuit closes the second switch and, after the capacitance value of the integral capacitance part is set according to the level signal outputted from the electric charge amount level determining circuit corresponding to the photodiode, closes the first switch corresponding to the photodiode. In this case, the capacitance value of the integral capacitance part in the integrating circuit is set rapidly, and the incident light intensity is detected with a high speed.

Preferably, the photodetector in accordance with the present invention comprises M sets (M being an integer of 2 or greater) each composed of the N photodiodes, the N electric charge amount level determining circuits, and the integrating circuit. Since M×N photodiodes are arranged, the number of pixels can further be increased in this case.

Preferably, the photodetector in accordance with the present invention comprises (1) the N photodiodes arranged on a first substrate; and (2) the N electric charge amount level determining circuits, integrating circuit, first switches, and second switches arranged on a second substrate; (3) wherein the first and second substrates are connected to each other with a bump, the photodiodes and the first switches corresponding thereto are electrically connected to each other, and the photodetectors and the electric charge amount level determining circuits corresponding thereto are electrically connected to each other. In this case, the first and second substrates can be manufactured by their respective optimal manufacturing processes, which is favorable in terms of improving the integration density.

BEST MODES FOR CARRYING OUT THE INVENTION

In the following, embodiments of the present invention will be explained in detail with reference to the accompanying drawings. In the explanation of the drawings, constituents identical to each other will be referred to with numerals identical to each other without repeating their overlapping descriptions.

Figure 1:
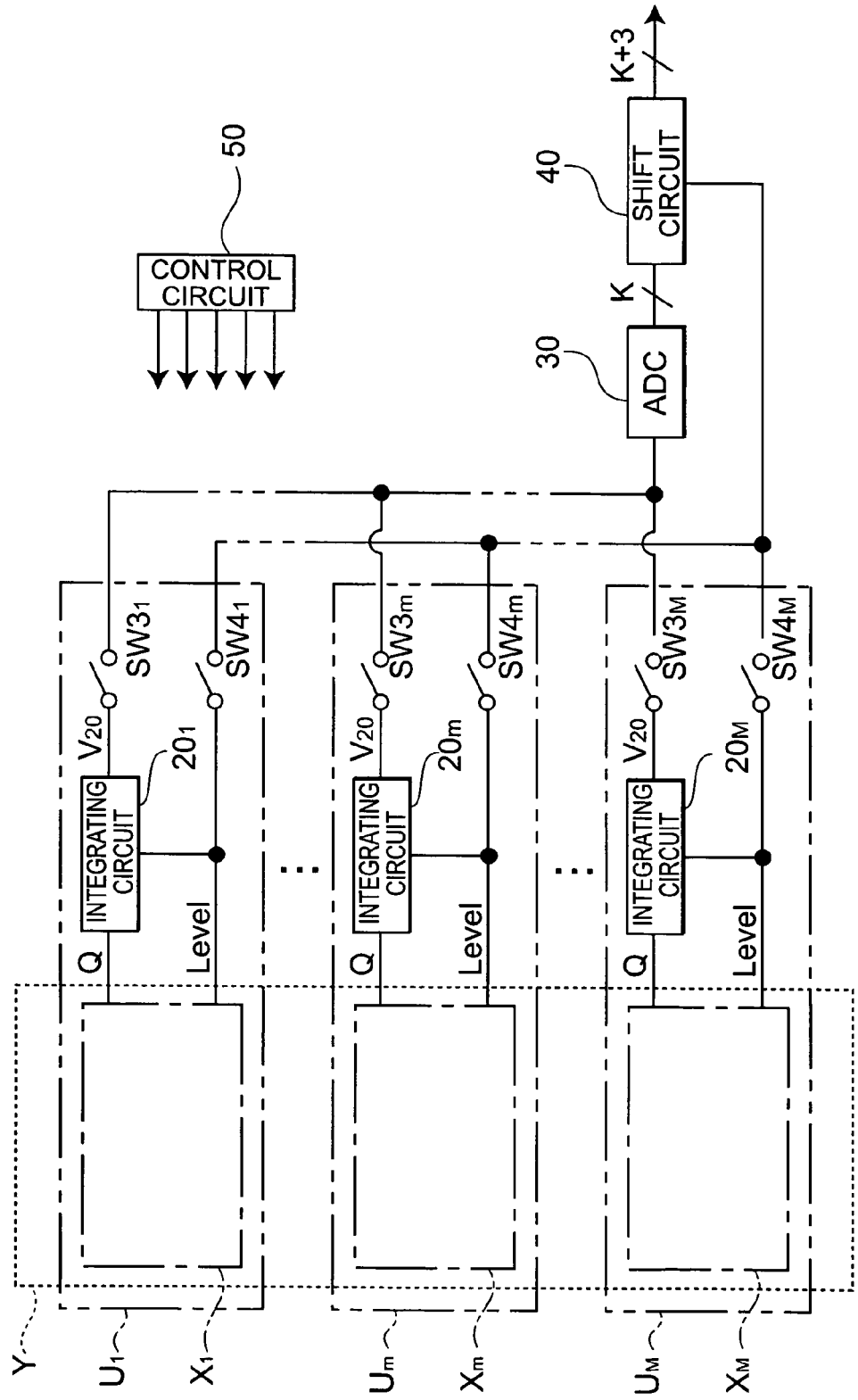
FIG. 1 is an overall diagram of a photodetector 1 in accordance with an embodiment.
Figure 2:
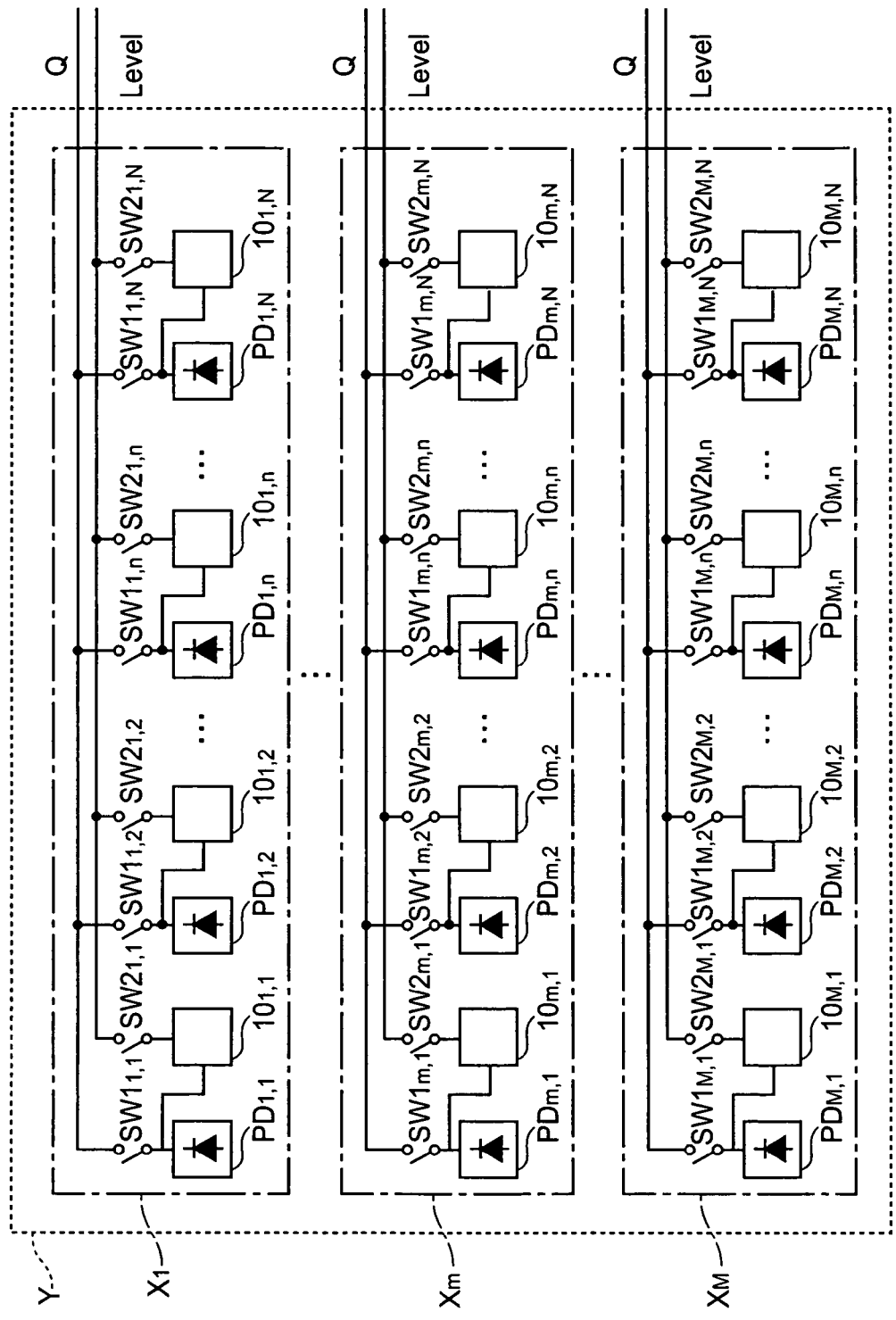
FIG. 2 is a partial diagram of the photodetector 1 in accordance with the embodiment.

FIG. 1 is an overall diagram of a photodetector 1 in accordance with an embodiment. FIG. 2 is a partial diagram of the photodetector 1 in accordance with this embodiment. FIG. 2 shows details of blocks $X_1$ to $X_M$ within the area Y indicated by dotted lines in FIG. 1. The photodetector 1 shown in these drawings comprises M units $U_1$ to $U_M$, an A/D converter 30, a shift circuit 40, and a control circuit 50. Each unit $U_m$ has the same configuration comprising N photodiodes $PD_{m,1}$ to $PD_{m,N}$, N electric charge amount level determining circuits $10_{m,1}$ to $10_{m,N}$, N first switches $SW1_{m,1}$ to $SW1_{m,N}$, N second switches $SW2_{m,1}$ to $SW2_{m,N}$, an integrating circuit $20_m$, a switch $SW3_m$, and a switch $SW4_m$. Here, M is an integer of 1 or greater, N is an integer of 2 or greater, m is an integer of at least 1 but not greater than M, and n in the following is an integer of at least 1 but not greater than N.

Each photodiode $PD_{m,n}$ generates electric charges Q by an amount corresponding to the intensity of light incident thereon. Switch $SW1_{m,n}$ is arranged between its corresponding photodiode $PD_{m,n}$ and the input terminal of the integrating circuit $20_m$, and can electrically be opened and closed.

Each electric charge amount level determining circuit $10_{m,n}$ is provided for its corresponding photodiode $PD_{m,n}$, determines the level of the amount of electric charges Q generated in the photodiode $PD_{m,n}$, and outputs a level signal Level indicative of the result of level determination. Switch $SW2_{m,n}$ is arranged between its corresponding electric charge amount level determining circuit $10_{m,n}$ and the integrating circuit $20_m$, and can electrically be opened and closed. The level signal Level is a digital signal of 1 bit or a plurality of bits, whereas the switch $SW2_{m,n}$ includes switches by the number corresponding to that of the bits.

The integrating circuit $20_m$ includes an integral capacitance part having a variable capacitance value, whose input terminal is connected to the photodiodes $PD_{m,n}$ by way of their corresponding switches $SW1_{m,n}$. As the switches $SW1_{m,1}$ to $SW1_{m,N}$ are sequentially opened and closed, the respective electric charges Q are sequentially outputted from the N photodiodes $PD_{m,1}$ to $PD_{m,N}$, so as to be fed into the input terminal and accumulated into the integral capacitance part, whereby a voltage $V_{20}$ corresponding to the amount of thus accumulated electric charges Q is outputted from an output terminal. On the other hand, the integral capacitance part is connected to the electric charge amount level determining circuits $10_{m,n}$ by way of their corresponding switches $SW2_{m,n}$. As the switches $SW2_{m,1}$ to $SW2_{m,N}$ are sequentially opened and closed, the level signals Level are sequentially inputted from the N electric charge amount level determining circuits $10_{m,n}$. According to thus inputted level signals Level, the capacitance value is set.

The A/D converter circuit 30 receives inputs of the voltages $V_{20}$ sequentially outputted from the output terminals of the integrating circuits $20_m$ by way of the switches $SW3_m$, A/D-converts the voltage $V_{20}$ into digital values, and outputs the digital values corresponding to the voltages $V_{20}$. The shift circuit 40 receives inputs of the digital values outputted from the A/D converter circuit 30, sequentially receives inputs of the respective level signals Level outputted from the electric charge amount level determining circuits $10_{m,1}$ to $10_{m,N}$ by way of the switches $SW2_{m,n}$ and switches $SW4_m$, shifts the bits of the digital values according to the level signals Level, and outputs thus bit-shifted digital values.

The control circuit 50 regulates operations of the photodetector 1 as a whole. In particular, the control circuit 50 regulates the opening and closing of each of the switches $SW1_{m,n}$ and $SW2_{m,n}$. Specifically, for each photodiode $PD_{m,n}$, the control circuit 50 closes the corresponding switch $SW2_{m,n}$ and, after the capacitance value of the integral capacitance part in the integrating circuit $20_m$ is set according to the level signal Level outputted from the corresponding electric charge amount level determining circuit $10_{m,n}$, closes the corresponding switch $SW1_{m,n}$, thereby starting an integrating operation in the integrating circuit $20_m$. The control circuit 50 also regulates timings of respective operations of the integrating circuits $20_m$, switches $SW3_m$, switches $SW4_m$, A/D converter circuit 30, and shift circuit 40. These operation timings will later be explained in detail. FIG. 1 omits control signals sent from the control circuit 50 to the other constituent circuits.

Figure 3:
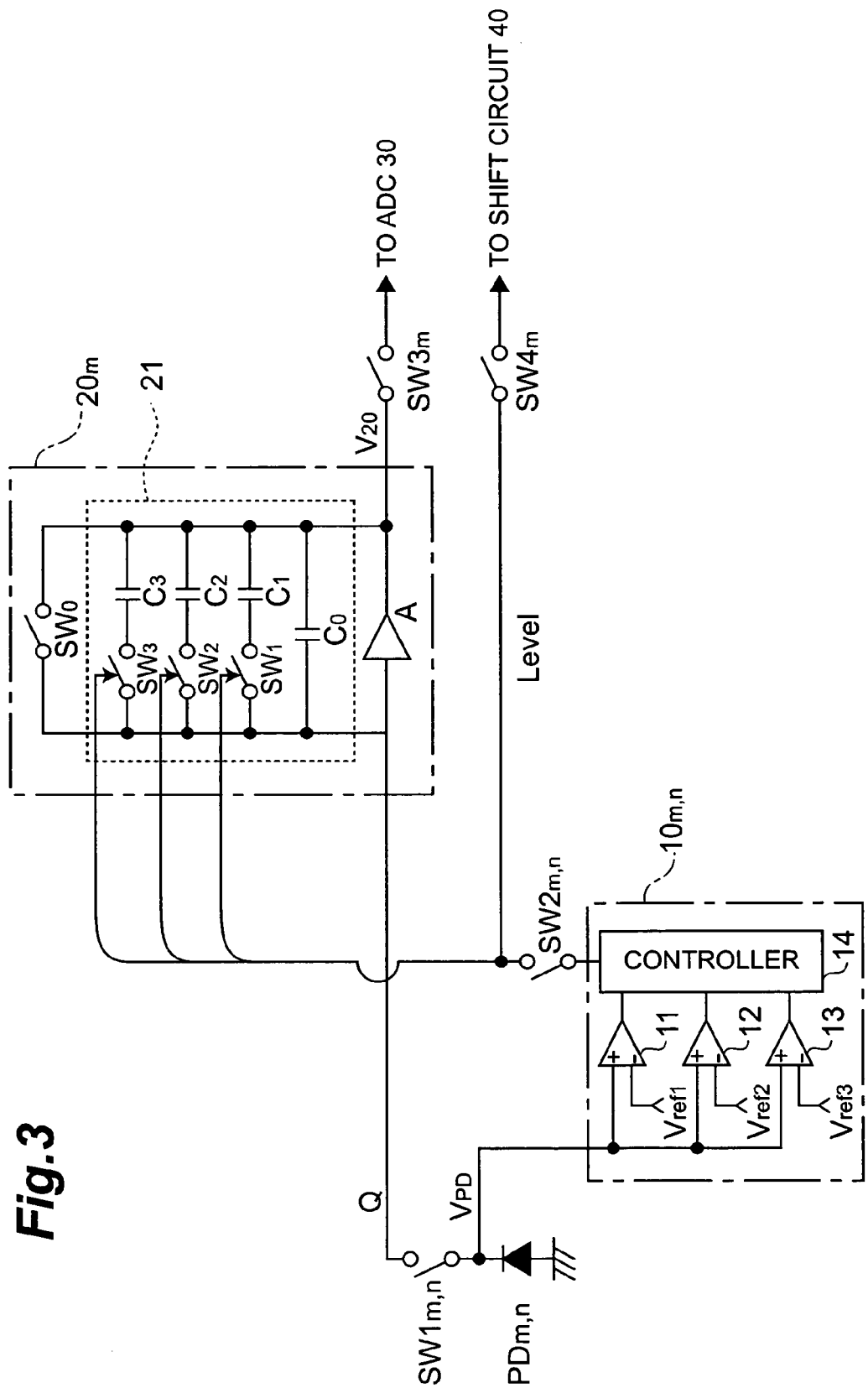
FIG. 3 is a circuit diagram of an electric charge amount level determining circuit $10_{m,n}$ and an integrating circuit $20_m$ which are included in the photodetector 1 in accordance with the embodiment.

FIG. 3 is a circuit diagram of the electric charge amount level determining circuit $10_{m,n}$ and integrating circuit $20_m$ included in the photodetector 1 in accordance with this embodiment. This diagram shows only the part corresponding to the n-th photodiode $PD_{m,n}$ within the m-th unit $U_m$.

The electric charge amount level determining circuit $10_{m,n}$ includes three comparators 11 to 13 and a controller 14. The non-inverting input terminal of each of the comparators 11 to 13 is connected to the junction between the cathode terminal of the photodiode $PD_{m,n}$ and the switch $SW1_{m,n}$. Reference voltages $V_{ref1}$, $V_{ref2}$, and $V_{ref3}$ are fed to the inverting input terminals of the comparators 11, 12, and 13, respectively. Each of the comparators 11 to 13 compares the respective voltages fed to its inverting and non-inverting input terminals in terms of magnitude, and outputs a signal indicative of the result of comparison to the controller 14. The controller 14 inputs the respective signals outputted from the comparators 11 to 13, and outputs a 3-bit level signal Level for setting the capacitance value of the integral capacitance part in the integrating circuit $20_m$.

Here, the reference voltages $V_{ref1}$ to $V_{ref3}$ satisfy the following relational expressions:

$$V_{ref1} = V_{sat}/2 \tag{1a}$$

$$V_{ref2} = V_{sat}/4 \tag{1b}$$

$$V_{ref3} = V_{sat}/8 \tag{1c}$$

Here, $V_{sat}$ is a constant value. Therefore, the three comparators 11 to 13 can determine within which of the following ranges:

$$V_{PD} < V_{sat}/8 \tag{2a}$$

$$V_{sat}/8 \leq V_{PD} < V_{sat}/4 \tag{2b}$$

$$V_{sat}/4 \leq V_{PD} < V_{sat}/2 \tag{2c}$$

$$V_{sat}/2 \leq V_{PD} \tag{2d}$$

the potential $V_{PD}$ of the cathode terminal of the photodiode $PD_{m,n}$ falls. The level signal Level outputted from the controller 14 indicates within which ranges of the above-mentioned expressions (2a) to (2d) the potential $V_{PD}$ falls.

The integrating circuit $20_m$ includes an amplifier A, capacitance elements $C_0$ to $C_3$, and switches $SW_0$ to $SW_3$. The input terminal of the amplifier A is connected to the cathode terminal of the photodiode $PD_{m,n}$ by way of the switch $SW1_{m,n}$. The output terminal of the amplifier A is connected to the A/D converter circuit 30 by way of the switch $SW3_m$. The switch $SW_1$ and capacitance element $C_1$ connected in series, the switch $SW_2$ and capacitance element $C_2$ connected in series, the switch $SW_3$ and capacitance element $C_3$ connected in series, the capacitance element $C_0$, and the switch $SW_0$ are connected in parallel between the input and output terminals of the amplifier A.

The capacitance elements $C_0$ to $C_3$ and switches $SW_1$ to $SW_3$ constitute an integral capacitance part 21 having a variable capacitance value. Namely, the switches $SW_1$ to $SW_3$ open and close depending on the level signal Level inputted from the controller 14 of the electric charge amount level determining circuit $10_{m,n}$ by way of the switch $SW2_{m,n}$, whereby the capacitance value of the integral capacitance part 21 is determined according to their states of opening/closing. Here, the respective capacitance values of the capacitance elements $C_0$ to $C_3$ satisfy the relational expressions of:

$$C_0 = C \tag{3a}$$

$$C_1 = C \tag{3b}$$

$$C_2 = 2C \tag{3c}$$

$$C_3 = 4C \tag{3d}$$

Here, C is a constant value.

The capacitance value of the integral capacitance part 21 is set when the respective opening/closing states of the switches $SW_1$ to $SW_3$ are set in response to the level signal Level, i.e., according to the potential $V_{PD}$ of the cathode terminal of the photodiode $PD_{m,n}$ determined by the three comparators 11 to 13, as follows. Namely, when it is determined that the potential $V_{PD}$ falls within the range of the above-mentioned expression (2a), all the switches $SW_1$ to $SW_3$ are opened, whereby the capacitance value of the integral capacitance part 21 is set to $C(=C_0)$. When it is determined that the potential $V_{PD}$ falls within the range of the above-mentioned expression (2b), only the switch $SW_1$ is closed, whereby the capacitance value of the integral capacitance part 21 is set to $2C(=C_0+C_1)$. When it is determined that the potential $V_{PD}$ falls within the range of the above-mentioned expression (2c), the switches $SW_1$ and $SW_2$ are closed, whereby the capacitance value of the integral capacitance part 21 is set to $4C(=C_0+C_1+C_2)$. When it is determined that the potential $V_{PD}$ falls within the range of the above-mentioned expression (2d), all the switches $SW_1$ to $SW_3$ are closed, whereby the capacitance value of the integral capacitance part 21 is set to $8C(=C_0+C_1+C_2+C_3)$. In any of these cases, the voltage $V_{20}$ outputted from the output terminal of the integrating circuit $20_m$ falls within the range of:

$$V_{sat}/2 \leq V_{20} < V_{sat} \tag{4}$$

The A/D converter circuit 30 receives inputs of the voltages $V_{20}$ sequentially arriving from the respective output terminals $20_m$ of the units $U_m$ by way of the switches $SW^3m$, A/D-converts the voltages $V_{20}$, and outputs digital values corresponding to the voltages $V_{20}$. Here, the voltages $V_{20}$ fed into the A/D converter circuit 30 always fall within the above-mentioned expression (4), whereby the A/D converter circuit 30 can effectively utilize all the bits of its outputting digital values when A/D-converting the voltages $V_{20}$.

The shift circuit 40 receives inputs of the digital values outputted from the A/D converter circuit 30, sequentially receives inputs of the respective level signals Level outputted from the electric charge amount level determining circuits $10_{m,l}$ to $10_{m,N}$, shifts the bits of digital values according to the level signals Level, and outputs the bit-shifted digital values. Namely, when a digital value outputted from the A/D converter circuit 30 is a digital value $(D_{K-1}, D_{K-2}, \ldots, D_1, D_0)$ having K bits (where K is an integer of 2 or greater), the shift circuit 40 outputs a digital value having (K+3) bits. When the level signal Level indicates that the potential $V_{PD}$ falls within the range of the above-mentioned expression (2a), the shift circuit 40 outputs the digital value $(0, 0, 0, D_{K-1}, D_{K-2}, \ldots, D_1, D_0)$ having (K+3) bits without shifting the bits of the inputted digital value. When the level signal Level indicates that the potential $V_{PD}$ falls within the range of the above-mentioned expression (2b), the shift circuit 40 shifts the inputted digital value by 1 bit to the higher order, and outputs thus obtained digital value $(0, 0, D_{K-1}, D_{K-2}, \ldots, D_1, D_0, 0)$ having (K+3) bits. When the level signal Level indicates that the potential $V_{PD}$ falls within the range of the above-mentioned expression (2c), the shift circuit 40 shifts the inputted digital value by 2 bits to the higher order, and outputs thus obtained digital value $(0, D_{K-1}, D_{K-2}, \ldots, D_1, D_0, 0, 0)$ having (K+3) bits. When the level signal Level indicates that the potential $V_{PD}$ falls within the range of the above-mentioned expression (2d), the shift circuit 40 shifts the inputted digital value by 3 bits to the higher order, and outputs thus obtained digital value $(D_{K-1}, D_{K-2}, \ldots, D_1, D_0, 0, 0, 0)$ having (K+3) bits.

Figure 4:
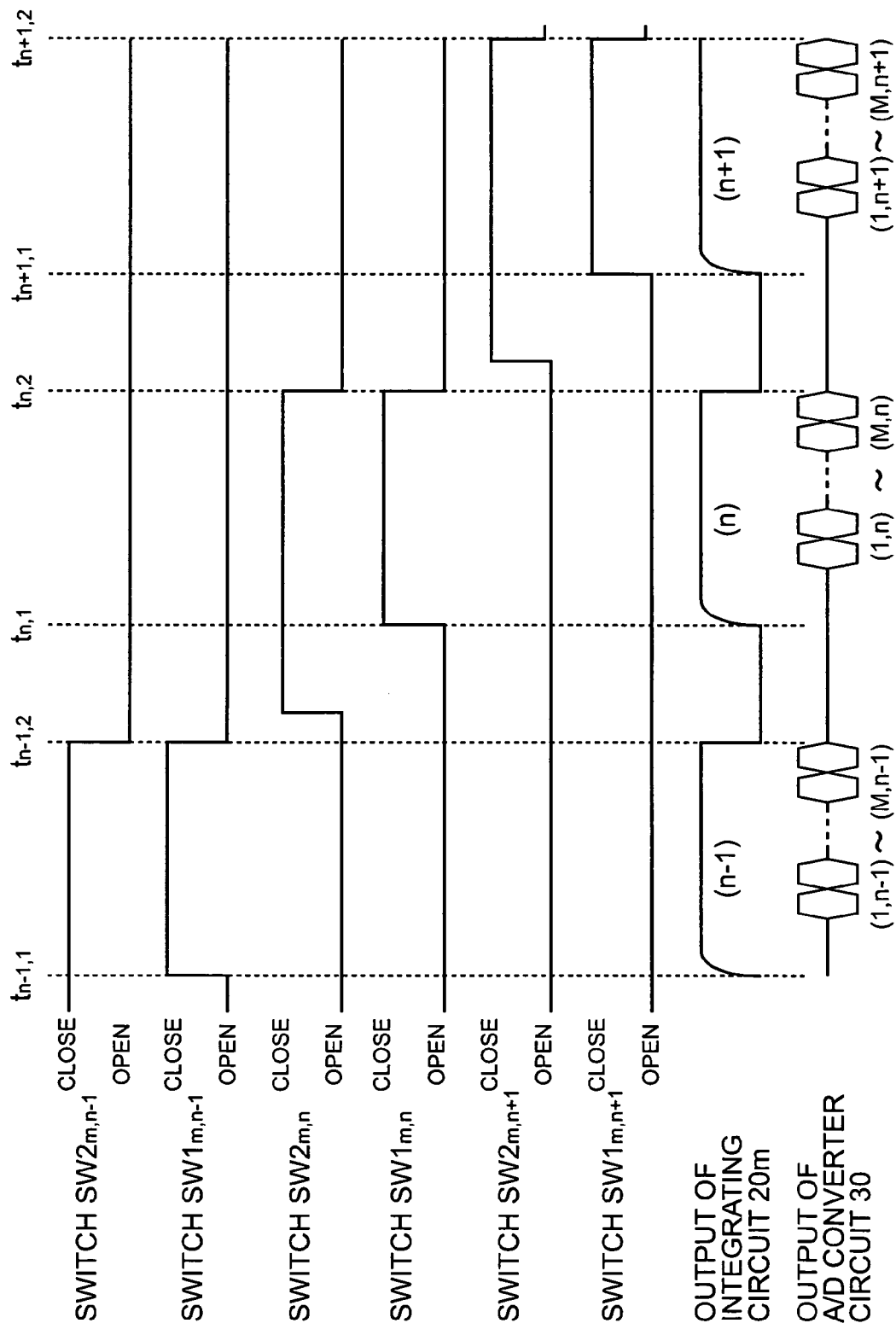
FIG. 4 is a timing chart for explaining operations of the photodetector 1 in accordance with the embodiment.

Operation timings of the photodetector 1 in accordance with this embodiment will now be explained. FIG. 4 is a timing chart for explaining operations of the photodetector 1 in accordance with this embodiment. This chart shows, successively from the upper side, respective opening/closing timings of the switches $SW2_{m,n-1}$ and $SW1_{m,n-1}$ corresponding to the photodiode $PD_{m,n-1}$, respective opening/closing timings of the switches $SW2_{m,n}$ and $SW1_{m,n}$ corresponding to the photodiode $PD_{m,n}$ arranged adjacent to the $PD_{m,n-1}$ in each unit $U_m$, respective opening/closing timings of the switches $SW2_{m,n+1}$ and $SW1_{m,n+1}$ corresponding to the photodiode $PD_{m,n+1}$ arranged adjacent to the $PD_{m,n}$ in each unit $U_m$, the output voltage $V_{20}$ from the integrating circuit $20_m$, and output digital values from the A/D converter circuit 30.

From time $t_{n-1,2}$ to time $t_{n,1}$, only the (n−1)-th switch $SW2_{m,n-1}$ in the N switches $SW2_{m,1}$ to $SW2_{m,N}$ is closed in each unit $U_m$, whereby the level signal Level outputted from the controller 14 of the (n−1)-th electric charge amount level determining circuit $10_{m,n-1}$ is fed into the integrating circuit $20_m$, so that the capacitance value of the integral capacitance part 21 in the integrating circuit $20_m$ is set according to this level signal. The level signal at this time indicates the level of the potential $V_{PD}$ of the cathode terminal of the photodiode $PD_{m,n}$ determined by the three comparators 11 to 13 of the electric charge amount level determining circuit $10_{m,n-1}$ and held by the controller 14 at the time $t_{n-1,2}$. The switch $SW_0$ of the integrating circuit $20_m$ is closed at the time $t_{n-1,2}$, so that the voltage $V_{20}$ outputted from the integrating circuit $20_m$ is initialized.

During the period from time $t_{n,1}$ to time $t_{n,2}$, only the n-th switch $SW1_{m,n}$ in the N switches $SW1_{m,1}$ to $SW1_{m,N}$ is closed in each unit $U_m$, while the switch $SW_0$ of the integrating circuit $20_m$ is open, whereby an integrating operation of the integrating circuit $20_m$ is carried out. The voltage $V_{20}$ outputted from the integrating circuit $20_m$ at this time corresponds to the amount of electric charge accumulated into the integral capacitance part 21 after being outputted from the n-th switch $SW1_{m,n}$ in the N switches $SW1_{m,1}$ to $SW1_{m,N}$ and the capacitance value of the integral capacitance part 21.

During the period from time $t_{n,1}$ to time $t_{n,2}$, the M switches $SW3_m$ are closed sequentially, and the M switches $SW4_m$ are closed sequentially. The voltages $V_{20}$ sequentially outputted from the M units $U_1$ to $U_M$ are converted into digital values by the A/D converter circuit 30, whereas these digital values are outputted from the shift circuit 40 after being bit-shifted thereby according to the level signals Level sequentially outputted from the M units $U_1$ to $U_M$. The digital values sequentially outputted from the shift circuit 40 at this time correspond to respective intensities of light incident on the n-th photodiodes $PD_{m,n}$ included in the M units $U_1$ to $U_M$.

At the time $t_{n,2}$, the n-th switches $SW1_{m,n}$ and $SW2_{m,n}$ are opened in each unit $U_m$, whereas the switch $SW_0$ in the integrating circuit $20_m$ is closed, whereby a series of operations concerning the n-th photodiode $PD_{m,n}$ end. During the period from time $t_{n,2}$ to time $t_{n+1,2}$, a series of operations concerning the (n+1)-th photodiode $PD_{m,n+1}$ are similarly carried out in each unit $U_m$. The same holds in subsequent periods.

Since an electric charge amount level determining circuit $10_{m,n}$ is provided for each photodiode $PD_{m,n}$ in the photodetector 1 in accordance with this embodiment as in the foregoing, an appropriate capacitance value corresponding to the amount of electric charges outputted from the photodiode $PD_{m,n}$ is set in the integral capacitance part 21 in the integrating circuit $20_m$, whereby the dynamic range for incident light intensity detection for each photodiode (i.e., per pixel in one picture) can be enlarged. Also, since electric charge amount level determining circuit $10_{m,n}$ is provided in a one-to-one relationship with each photodiode $PD_{m,n}$, the capacitance value of the integral capacitance part 21 in the integrating circuit $20_m$ is set rapidly, whereby the incident light intensity can be detected with a high speed. Since each electric charge amount level determining circuit $10_{m,n}$ does not require high-speed processing at the time of determining the electric charge amount level, the power consumption can be saved.

Figure 5:
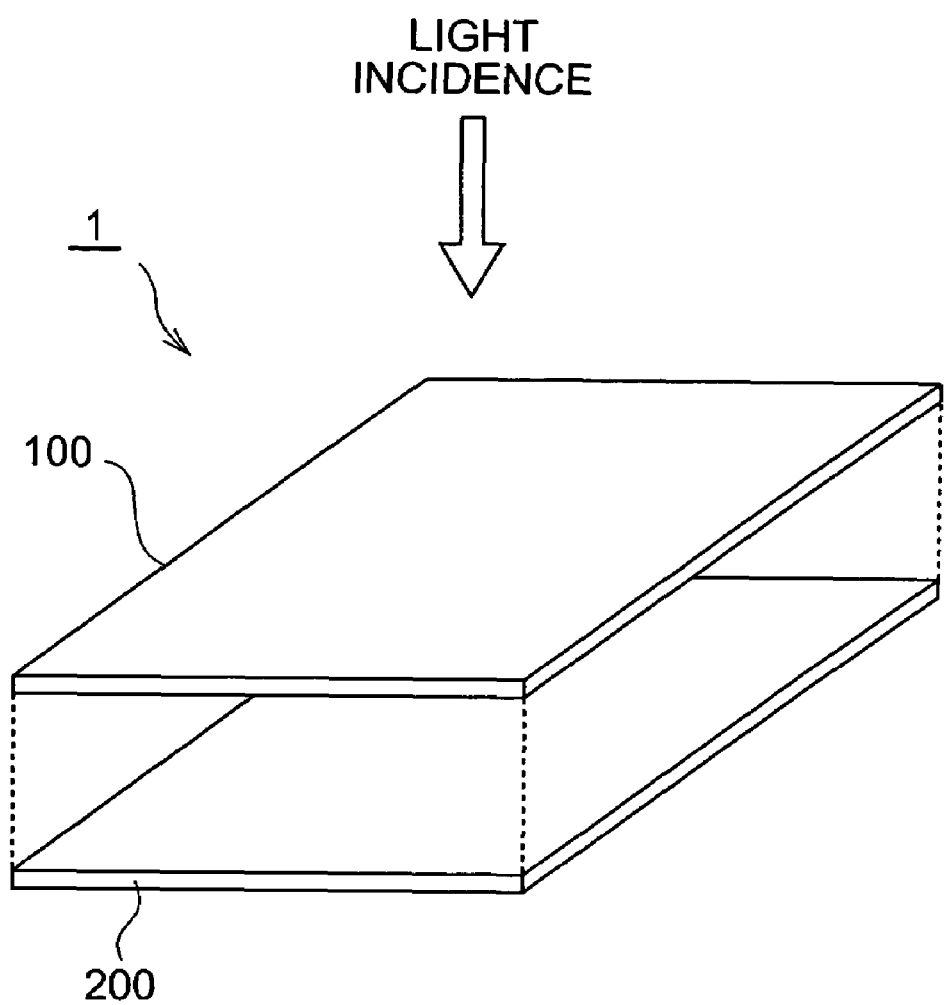
FIG. 5 is a perspective view showing the relationship of arrangement of a first substrate 100 and a second substrate 200 in the photodetector 1 in accordance with the embodiment.

A mode of mounting the photodetector 1 in accordance with this embodiment will now be explained with reference to FIGS. 5 to 7. FIG. 5 is a perspective view showing the relationship of arrangement of a first substrate 100 and a second substrate 200 in the photodetector 1 in accordance with this embodiment. As shown in this drawing, the photodetector 1 is split onto two substrates, i.e., the first substrate 100 and the second substrate 200. On the first substrate 100, M×N photodiodes $PD_{1,1}$ to $PD_{M,N}$ are arranged in a matrix of M rows by N columns. On the second substrate 200, M×N electric charge amount level determining circuits $10_{1,1}$ to $10_{M,N}$, M×N switches $SW1_{1,1}$ to $SW1_{M,N}$, M×N switches $SW2_{1,1}$ to $SW2_{M,N}$, M integrating circuits $20_1$ to $20_M$, M switches $SW3_1$ to $SW3_M$, M switches $SW4_1$ to $SW4_M$, an A/D converter circuit 30, a shift circuit 40, and a control circuit 50 are arranged. As shown in this drawing, the substrates are mounted while being laminated such that they are overlaid on each other in the light incidence direction. The respective cathode electrodes of the photodiodes $PD_{m,n}$ on the first substrate 100 are electrically connected to their corresponding switches $SW1_{m,n}$ and electric charge amount level determining circuits $10_{m,n}$ on the second substrate 200 by way of bumps.

Figure 6:
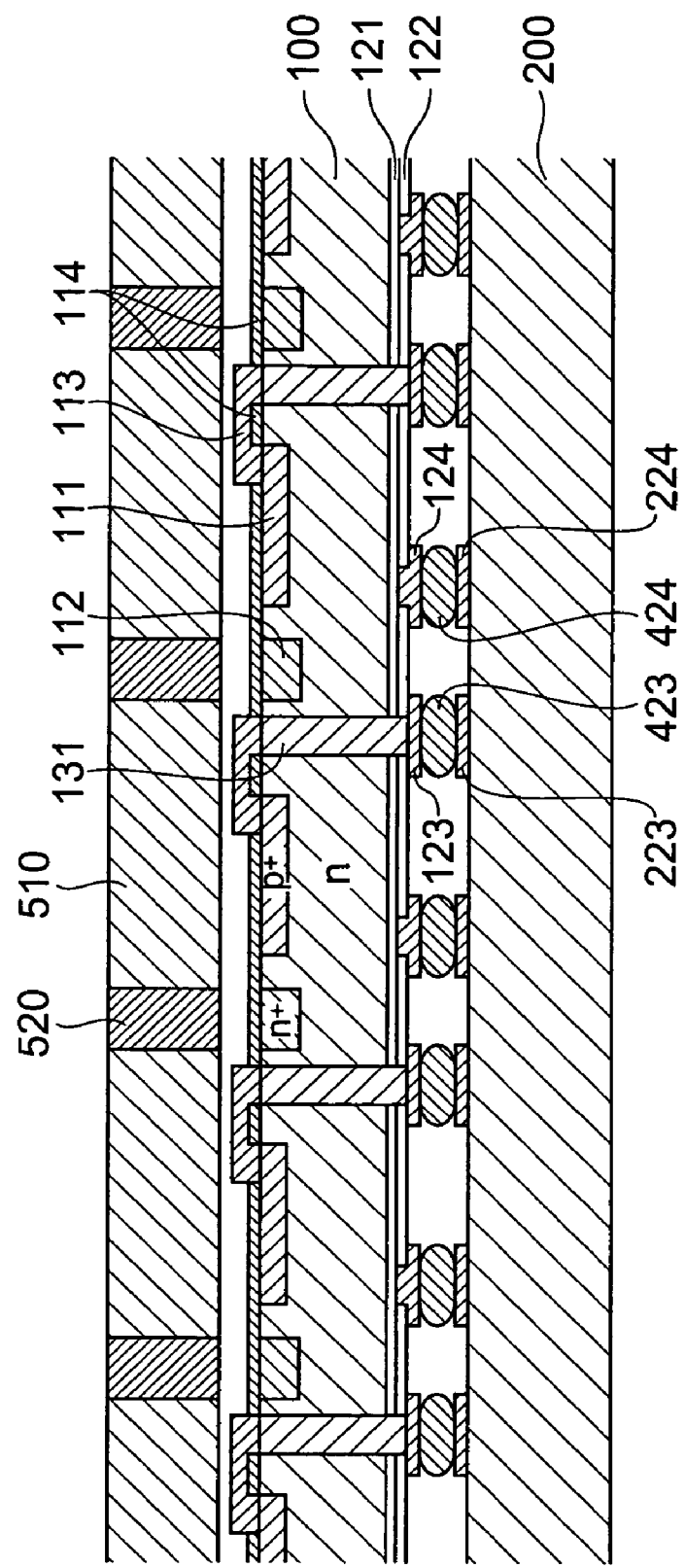
FIG. 6 is a view showing an example of cross sections of the first substrate 100 and second substrate 200 in the photodetector 1 in accordance with the embodiment.

FIG. 6 is a view showing an example of cross sections of the first substrate 100 and second substrate 200 in the photodetector 1 in accordance with this embodiment. Since a basic pattern is repeated in the lateral direction in this drawing, only one basic pattern will be explained in the following.

Formed on a first surface (the upper face in the drawing) of an n-type semiconductor substrate in the first substrate 100 are a $p^+$ region 111 constructing a photodiode PD by forming a pn junction with the n-type substrate, and an $n^+$ region 112 as an isolation region. Formed on a second surface (the lower face in the drawing) of the n-type semiconductor substrate in the first substrate 100 are an $n^+$-type impurity layer 121 forming an ohmic connection with a bonding pad 124, an insulating protective layer 122 for protecting the surface, and the bonding pad 124 penetrating through the protective layer 122 so as to be electrically connected to the $n^+$-type impurity layer 121. A through hole is formed so as to penetrate through the first substrate 100 between the first and second surfaces, whereas a through electrode 131 is arranged within the through hole by way of an insulator layer formed on the inner wall. A metal lead 113 for electrically connecting the $p^+$ region 111 to the through electrode 131 is formed on an insulating film 114 on the first surface side of the first substrate 100, whereas a bonding pad 123 electrically connected to the through electrode 131 is formed on the second surface side.

Formed on a first surface (the upper face in the drawing) of a semiconductor substrate in the second substrate 200 are a bonding pad 223 electrically connected to a first terminal of a switch SW1, and a bonding pad 224 electrically connected to a ground potential. The bonding pad 123 of the first substrate 100 and the bonding pad 223 of the second substrate 200 are connected to each other with a bump 423, whereas the bonding pad 124 of the first substrate 100 and the bonding pad 224 of the second substrate 200 are connected to each other with a bump 424. The gap between the first substrate 100 and second substrate 200 is filled with a resin.

A scintillator 510 and a shield plate 520 are arranged on the first surface side of the first substrate 100. The scintillator 510 is arranged above the $p^+$ region 111 of the first substrate 100, and generates scintillation light when energy lines such as X-rays are incident thereon. The shield plate 520, which is arranged above the $n^+$ region 112 of the first substrate 100, inhibits energy lines such as X-rays from penetrating therethrough and secures the scintillator 510.

When energy lines such as X-rays are incident on the scintillator 510 in the configuration shown in FIG. 6, the scintillator 510 generates scintillation light. When the scintillation light is incident on the $p^+$ region 111 of the first substrate 100, electric charges are generated in its pn junction. These electric charges pass the metal lead 113, the through electrode 131, the bonding pad 123, the bump 423, and the bonding pad 223 of the second substrate 200, so as to be fed to the input terminal of the integrating circuit 20 by way of the switch SW1 formed on the second substrate 200.

Figure 7:
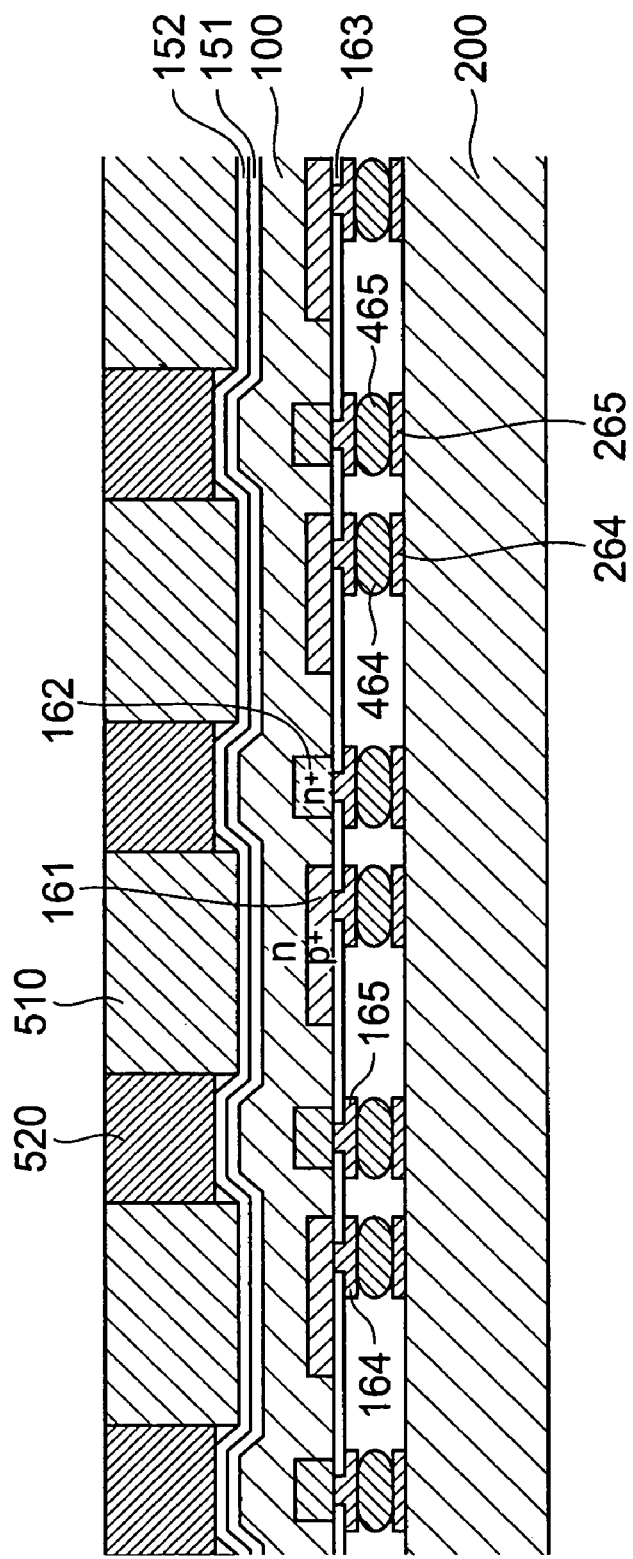
FIG. 7 is a view showing another example of cross sections of the first substrate 100 and second substrate 200 in the photodetector 1 in accordance with the embodiment.

FIG. 7 is a view showing another example of cross sections of the first substrate 100 and second substrate 200 in the photodetector 1 in accordance with this embodiment. Since a basic pattern is also repeated in the lateral direction in this drawing, only one basic pattern will be explained in the following.

Formed on a first surface (the upper face in the drawing) of an n-type semiconductor substrate in the first substrate 100 are an $n^+$-type accumulation layer 151 for preventing electric charges from recombining, and an insulating protective layer 152 for protecting the surface. Formed on a second surface (the lower face in the drawing) of the n-type semiconductor substrate in the first substrate 100 are a $p^+$ region 161 forming a pn junction with the n-type substrate so as to construct a photodiode PD, and an $n^+$ region 162 as an isolation region, whereas a protective layer 163 is formed on them. Also formed on the second surface of the first substrate 100 are a bonding pad 164 electrically connected to the $p^+$ region 161, and a bonding pad 165 electrically connected to the $n^+$ region 162.

Formed on a first surface (the upper face in the drawing) of a semiconductor in the second substrate 200 are bonding pads 264 electrically connected to a first terminal of the switch SW1, and a bonding pad 265 electrically connected to a ground potential. The bonding pad 164 of the first substrate 100 and the bonding pad 264 of the second substrate 200 are connected to each other with a bump 464. The bonding pad 165 of the first substrate 100 and the bonding pad 265 of the second substrate 200 are connected to each other with a bump 465. The gap between the first substrate 100 and second substrate 200 is filled with a resin.

A scintillator 510 and a shield plate 520 are arranged on the first surface side of the first substrate 100. The scintillator 510 is arranged above the $p^+$ region 161 of the first substrate 100, and generates scintillation light when energy lines such as X-rays are incident thereon. The shield plate 520, which is arranged above the $n^+$ region 162 of the first substrate 100, inhibits energy lines such as X-rays from penetrating therethrough and secures the scintillator 510. The first substrate 100 is etched on the first surface side in the part formed with the $p^+$ region 161, so as to be thinned.

When energy lines such as X-rays are incident on the scintillator 510 in the configuration shown in FIG. 7, the scintillator 510 generates scintillation light. When the scintillation light is incident on the $p^+$ region 161 through the first substrate 100, electric charges are generated in the pn junction. These electric charges pass the bonding pad 164, the bump 464, and the bonding pad 264 of the second substrate 200, and are fed to the input terminal of the integrating circuit 20 by way of the switch SW1 formed on the second substrate 200.

The photodetector 1 in accordance with this embodiment constructed as in the foregoing can exhibit the following effects. Namely, the electric charge migration path from each photodiode $PD_{m,n}$ to the input terminal of the integrating circuit $20_m$ becomes shorter, so that the parasitic capacitance in the wiring on the path becomes smaller, which reduces the noise included in the voltage outputted from the integrating circuit $20_m$, thereby making it possible to detect light accurately. Since circuits for signal processing such as the integrating circuit $20_m$ are not provided on the first substrate 100, an increase in the number of pixels or a higher density can be achieved. Also, the second substrate 200 can be made smaller than the first substrate 100, so that, when arranging a plurality of photodetectors 1, the first substrates 100 each provided with a photodiode can be arranged very close to each other or in contact with each other. It is also favorable in that respective optimal processes can be employed for the first substrate 100 formed with a photodiode array and the second substrate 200 formed with a signal processing circuit such as the integrating circuit $20_m$.

Without being restricted to the above-mentioned embodiment, the present invention can be modified in various manners. For example, the cross-sectional structures of the first substrate 100 and second substrate 200 are not restricted to those shown in FIGS. 6 and 7. Other circuits may also be provided on the second substrate 200. The number of thresholds for determining the electric charge amount level in the electric charge amount level determining circuit $10_{m,n}$ is arbitrary. Depending on this number, the number of cases of capacitance values attainable by the integral capacitance part of the integrating circuit $20_m$ is determined.

INDUSTRIAL APPLICABILITY

In the photodetector in accordance with the present invention, as explained in detail in the foregoing, electric charges are generated by an amount corresponding to the intensity of light incident on photodiodes, and the level of electric charges is determined by the electric charge amount level determining circuit. According to thus determined electric charge amount, the capacitance value of the integral capacitance part in the integrating circuit is set. Thereafter, in the integrating circuit, the electric charges generated by the photodiodes are accumulated in the integral capacitance part, and a voltage signal having a value corresponding to the amount of accumulated electric charges is outputted. When the incident light intensity is high, the capacitance value of the variable capacitance part in the integrating circuit is set to a relatively large value, whereby even the high incident light intensity can be detected without saturation. When the incident light intensity is low, on the other hand, the capacitance value of the variable capacitance part in the integrating circuit is set to a relatively small value, whereby even the low incident light intensity can be detected with a favorable sensitivity. Since the electric charge amount level determining circuits are provided in a one-to-one relationship with respect to the photodiodes in this photodetector, the capacitance value of the integral capacitance part in the integrating circuit can be set rapidly, whereby the incident light intensity can be detected with a high speed.

The invention claimed is:

1. A photodetector comprising:
N photodiodes (N being an integer of 2 or greater) each generating an electric charge by an amount corresponding to an intensity of light incident thereon;
N electric charge amount level determining circuits, respectively arranged so as to correspond to the N photodiodes, for determining respective levels of amounts of electric charges generated in the photodiodes and outputting respective level signals indicative of results of level determinations;
an integrating circuit including an input terminal, an output terminal, and an integral capacitance part having a variable capacitance value, which is set according to the level signal, accumulating an electric charge fed from the input terminal into the integral capacitance part, and outputting a voltage corresponding to an amount of the accumulated electric charge, from the output terminal;
first switches respectively provided so as to correspond to the N photodiodes, and arranged between the respective photodiodes and the input terminal of the integrating circuit; and
second switches respectively provided so as to correspond to the N electric charge amount level determining circuits, and arranged between the respective electric charge amount level determining circuits and the integral capacitance part; and
wherein:
the N photodiodes are arranged on a first substrate;
the N electric charge amount level determining circuits, integrating circuit, first switches, and second switches are arranged on a second substrate; and
the first and second substrates are connected to each other with a bump, the photodiodes and the first switches corresponding thereto are electrically connected to each other, and the photodetectors and the electric charge amount level determining circuits corresponding thereto are electrically connected to each other.

2. The photodetector according to claim 1, further comprising an A/D converter circuit for inputting the voltage outputted from the output terminal of the integrating circuit, A/D-converting the voltage into a digital value corresponding to the voltage, and outputting the digital value.

3. The photodetector according to claim 2, further comprising a shift circuit for inputting the digital value outputted from the A/D converter circuit, shifting a bit of the digital value according to the level signal, and outputting the digital value having the shifted bit.

4. The photodetector according to claim 3, wherein the integral capacitance part is settable to a first or second capacitance value;
wherein the first capacitance value is $2^p$ times as large as the second capacitance value (p being an integer of 1 or greater);
wherein the A/D converter circuit outputs a digital value with a bit number of p or greater; and
wherein the shift circuit shifts the digital value by p bits according to the level signal.

5. The photodetector according to claim 1, further comprising a control circuit for controlling opening and closing of each of the first and second switches;
wherein, for each of the N photodiodes, the control circuit closes the second switch and, after the capacitance value of the integral capacitance part is set according to the level signal outputted from the electric charge amount level determining circuit corresponding to the photodiode, closes the first switch corresponding to the photodiode.

6. The photodetector according to claim 1, comprising M sets (M being an integer of 2 or greater) each composed of the N photodiodes, the N electric charge amount level determining circuits, and the integrating circuit.

* * * * *